(12) United States Patent
Hawker et al.

(10) Patent No.: US 6,992,115 B2
(45) Date of Patent: Jan. 31, 2006

(54) PREPARATION OF CROSSLINKED PARTICLES FROM POLYMERS HAVING ACTIVATIBLE CROSSLINKING GROUPS

(75) Inventors: Craig Jon Hawker, Los Gatos, CA (US); Robert Dennis Miller, San Jose, CA (US); James Lupton Hedrick, Pleasanton, CA (US); Victor Yee-Way Lee, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/775,713

(22) Filed: Feb. 9, 2004

(65) Prior Publication Data

US 2005/0202338 A1 Sep. 15, 2005

Related U.S. Application Data

(62) Division of application No. 10/092,641, filed on Mar. 6, 2002, now Pat. No. 6,890,703.

(51) Int. Cl.
*C08J 3/24* (2006.01)
*C08J 3/28* (2006.01)

(52) U.S. Cl. ............... 521/25; 521/29; 521/77; 521/134; 521/139; 430/270.1; 430/296

(58) Field of Classification Search ............ 430/270.1, 430/296; 521/77, 134, 139, 25, 29
See application file for complete search history.

(56) References Cited

U.S. PATENT DOCUMENTS

| 4,829,144 | A | | 5/1989 | Brunelle et al. | |
|---|---|---|---|---|---|
| 5,039,783 | A | | 8/1991 | Brunelle et al. | |
| 5,041,516 | A | | 8/1991 | Fréchet et al. | |
| 5,407,984 | A | | 4/1995 | Brunelle et al. | |
| 5,431,790 | A | * | 7/1995 | Nesburn et al. | ....... 204/157.68 |
| 5,514,764 | A | | 5/1996 | Frechet et al. | |
| 5,585,408 | A | | 12/1996 | Harris et al. | |
| 5,616,622 | A | | 4/1997 | Harris et al. | |
| 5,668,186 | A | | 9/1997 | Brunelle et al. | |
| 5,965,679 | A | | 10/1999 | Godschalx et al. | |
| 6,107,357 | A | | 8/2000 | Hawker et al. | |
| 6,110,649 | A | | 8/2000 | Carter et al. | |
| 6,288,188 | B1 | | 9/2001 | Godschalx et al. | |

FOREIGN PATENT DOCUMENTS

| DE | 19754304 A1 | 6/1999 |
|---|---|---|
| DE | 19947631 A1 | 6/2000 |
| DE | 19922368 A1 | 11/2000 |
| JP | 10508061 T2 | 8/1998 |
| WO | WO 96/11054 | 4/1996 |
| WO | WO 99/43359 | 9/1999 |
| WO | WO 00/78846 | 12/2000 |

OTHER PUBLICATIONS

Auweter (2000), "Production and Characterization of Organic Nanoparticles" seminar abstract, Clarkson University Department of Chemical Engineering and Center of Advanced Materials Processing (abstract printed Jun. 29, 2001 from URL: http://cu.clarkson.edu/~maigafat/PCON.html).

Mercerreyes et al. (2001), "A Novel Approach to Functionalized Nanoparticles: Self-Crosslinking of Macromolecules in Ultradilute Solution," *Advanced Materials* 13(3):204-208.

Wooley (2000), "Shell Crosslinked Polymer Assemblies: Nanoscale Constructs Inspired from Biological Systems," *Journal of Polymer Science: Part A: Polymer Chemistry* 38:1397-1407.

* cited by examiner

*Primary Examiner*—John A. McPherson
*Assistant Examiner*—Daborah Chacko-Davis
(74) *Attorney, Agent, or Firm*—Reed IP Law Group (57) ABSTRACT

Crosslinked particles are provided that are useful in the manufacture of dielectric materials for use in electronic devices such as integrated circuits. The crosslinked particles are prepared by activating crosslinkable groups on synthetic polymer molecules, where the crosslinkable groups are inert until activated and, when activated, undergo an irreversible intramolecular crosslinking reaction to form crosslinked particles.

64 Claims, 2 Drawing Sheets

PREPARATION OF CROSSLINKED PARTICLES FROM POLYMERS HAVING ACTIVATIBLE CROSSLINKING GROUPS

CROSS-REFERENCE TO RELATED APPLICATIONS

This is a divisional of U.S. patent application Ser. No. 10/092,641, filed Mar. 6, 2002 now U.S. Pat. No. 6,890,703, the disclosure of which is incorporated by reference in its entirety.

ACKNOWLEDGEMENT OF GOVERNMENT RIGHTS

The U.S. Government has a paid-up license in this invention and the right in limited circumstances to require the patent owner to license others on reasonable terms as provided for by the terms of Cooperative Agreement No. 70NANB8H4013 awarded by NIST (Advanced Technology Program).

This invention was made with United States Government support under the above-referenced Cooperative Agreement awarded by NIST. The United States Government has certain rights in the invention.

FIELD OF THE INVENTION

This invention relates to methods for preparing crosslinked particles. More particularly, the invention relates to the preparation of nanoparticles.

BACKGROUND OF THE INVENTION

Nanoparticles find utility in numerous fields such as in nanotechnology, coatings, controlled release systems and so forth. Although various manufacturing processes have been developed to prepare polymeric nanoparticles, such processes continue to have problems, due in part to the small size of the nanoparticles, which typically have a diameter less than 20 nanometers ("nm"). There is a renewed interest in nanoparticles and in their manufacture due to the realization that functionalized nanoparticles can be considered as building blocks for a variety of nanotechnological applications, ranging from vectors for drug and DNA delivery systems to templating agents for nanoporous microelectronic materials.

The manufacturing approaches to nanoparticles can be broadly classified into two main areas, a top-down approach and a bottom-up technique. The top-down approach involves emulsion polymerization techniques, which are useful for manufacturing nanoparticles that are greater than 100 nm in diameter. Such emulsion techniques have been further refined and optimized leading to the development of microemulsion techniques that permit particles in the 20–50 nm range to be prepared.

Bottom-up techniques rely on the synthesis of discrete spherical macromolecules such as dendrimers (1–10 nm) (Fréchet et al., U.S. Pat. No. 5,514,764; Fréchet et al. U.S. Pat. No. 5,041,516) or the self-assembly of linear block copolymers into spherical structures followed by chemical crosslinking to give the final nanoparticle with dimensions from 10–50 nm (Wooley, *Journal of Polymer Science Part A: Polymer Chemistry* 38(9):1397–1407 (2000)).

An alternate approach to manufacturing well-defined nanoparticles has recently been developed which involves the attempted collapse and intra-molecular crosslinking of single polymer chains to give discrete nanoparticles (Mecerreyes et al., *Advanced Materials* 13(3):204–208 (2001)). While promising, this strategy suffers from numerous drawbacks, for example the competing inter-molecular crosslinking reaction necessitates the use of ultra-dilute reaction conditions, which precludes the viable large scale synthesis of these nanoparticles. In addition, even at these ultra-dilute conditions inter-molecular crosslinking is still evident and so the ultimate objective of collapsing a single linear chain to give a single nanoparticle is not realized.

Therefore there remains a continuing need to find improved methods of manufacturing nanoparticles. The present invention addresses those needs by means of a pseudo high dilution process that allows for the synthesis of discrete, well-defined and functionalized nanoparticles by intra-molecular crosslinking.

SUMMARY OF THE INVENTION

One aspect of the invention relates to a method for preparing crosslinked particles, comprising: (a) providing synthetic polymer molecules having a plurality of crosslinkable groups that are inert until activated, but which when activated undergo an irreversible intramolecular crosslinking reaction; and (b) activating the crosslinkable groups under crosslinking conditions, whereby irreversible intramolecular crosslinking of the polymer molecules occurs to form crosslinked particles.

Another aspect of the invention relates to a method for preparing crosslinked particles, comprising: (a) providing synthetic polymer molecules having a plurality of crosslinkable groups that are inert until activated, but which when activated undergo an irreversible intramolecular crosslinking reaction; and (b) activating the crosslinkable groups under conditions effective to promote said intramolecular crosslinking reaction, such that crosslinked particles are formed; and wherein the conditions in (b) are effective to substantially prevent intermolecular crosslinking between the polymer molecules, such that (b) results in formation of a single crosslinked particle from a single corresponding polymer molecule.

Yet another aspect of the invention pertains to a method for preparing crosslinked particles in a solvent, comprising: (a) providing synthetic polymer molecules having a plurality of crosslinkable groups that are inert until activated, but which when activated undergo an irreversible intramolecular crosslinking reaction to form a crosslinked particle; (b) activating the crosslinkable groups; and (c) adding the synthetic polymer molecules to a solvent under conditions effective to allow said irreversible intramolecular crosslinking reaction to take place while substantially preventing intermolecular reaction, resulting in formation of a single crosslinked particle from a corresponding polymer molecule in said solvent.

Still another aspect of the invention relates to a method for preparing a porous dielectric material, comprising: (a) providing synthetic polymer molecules having a plurality of crosslinkable groups that are inert until activated, but which when activated undergo an irreversible intramolecular crosslinking reaction; (b) activating the crosslinkable groups under crosslinking conditions, whereby irreversible intramolecular crosslinking of the polymer molecules occurs to form crosslinked particles; (c) mixing the crosslinked particles with a host matrix material to form a mixture, wherein the decomposition temperature of the crosslinked particles is less than the decomposition temperature of the host matrix material; and (d) heating the mixture to the decomposition temperature of the crosslinked particles, so that the crosslinked particles decompose to create a porous dielectric material.

Another aspect of the invention pertains to a method for forming an integrated circuit comprising: (a) positioning, on a substrate, a layer of a mixture of crosslinked particles having diameters less than about 25 nm and a host matrix material, wherein the decomposition temperature of the crosslinked particles is less than the decomposition temperature of the host matrix material; (b) heating the mixture to the decomposition temperature of the crosslinked particles to decompose the crosslinked particles and create a porous dielectric layer; (c) lithographically patterning the dielectric layer; (d) depositing a metallic film on the patterned dielectric layer; and (e) planarizing the film to form an integrated circuit.

Yet another aspect of the invention is a porous dielectric matrix comprised of an organic material and having closed cell pores whose diameters fall substantially in the range of 2–25 nm.

Still another aspect of the invention relates to an integrated circuit comprising a patterned dielectric layer and a planarized metallic film, wherein the dielectric matrix is comprised of an organic material and having closed cell pores whose diameters fall substantially in the range of 2–25 nm.

DETAILED DESCRIPTION OF THE INVENTION

The present invention comprises methods for preparing crosslinked particles by means of a pseudo high dilution method, which allows for the manufacture of crosslinked particles having a wide variety of structures and chemical compositions. This is achieved in part due to the accurate controls that can be obtained with a pseudo high dilution method. The amount of intra-molecular crosslinking of the synthetic polymer starting materials is controlled to give well-defined nanoparticles with no or minimal inter-molecular coupling. In addition, the size and crosslink density of these nanoparticles is controlled by the initial degree of polymerization of the polymer and the level of incorporation of the crosslinkable functional groups.

In the methods of the present invention, the previously required conditions of ultra-high dilution need only be meet for the reactive intermediates and not for the polymers themselves resulting in a pseudo-high dilution system. Following crosslinking, the intra-molecularly crosslinked nanoparticles are unreactive and so their concentration can build up to very high levels, i.e., molar concentrations as compared with micromolar concentrations obtained using traditional ultra-high dilution techniques.

The methods of the invention find utility in producing nanoparticles having a diameter within the range of approximately 2 to 100 nanometers ("nm"). However, in some embodiments, the nanoparticles may have a diameter within the range of approximately 2 nm to 25 nm, more particularly within the range of approximately 2 nm to 10 nm.

Before describing detailed embodiments of the invention, it will be useful to note that when examples are given, they are intended to be exemplary only and not to be restrictive. For example, when a given example is said to "include" a specific feature, that is not intended to imply that all implementations of the invention necessarily include that feature.

Materials

Synthetic Polymer Molecules

The synthetic polymer molecules used in the methods of the invention are typically comprised of linear or branched polymer chains, where the branched polymer can be a star polymer, a hyperbranched polymer, a graft polymer, a dendritic polymer or a combination thereof. The synthetic polymer molecule can also be a block copolymer, where the crosslinkable groups are typically contained in at least one block of the polymer molecule.

The polymer molecules will typically have a number average molecular weight in the range of about 500 to 5,000,000, more typically within the range of about 10,000 to 500,000. The molecular weight of the polymer molecules is typically selected so as to provide crosslinked particles that are approximately 2–100 nm in diameter. In one embodiment, the molecular weight is selected to provide crosslinked particles approximately 2–25 nm in diameter and in yet another embodiment, the molecular weight is selected so as to provide approximately 2–10 nm particles.

In one embodiment of the invention, the synthetic polymer molecule has a backbone comprised of monomer units selected from the group consisting of ethylenically unsaturated polymerizable monomers, nitrogenous polymers, olefins, condensation monomers, ring-opening monomers including epoxides and norbornenes, esters, sulfones, lactides, lactones, carbonates, imides, arylenes, amides, propylene, ethers, urethanes, vinyl and vinyl derivatives, and organic polysilicas, non-limiting examples of which are described below.

Exemplary ethylenically unsaturated polymerizable monomers include acrylic and methacrylic acids, esters and amides; alkyl acrylates (e.g., methyl acrylate, ethyl acrylate and butyl acrylate); aryl acrylates (e.g., benzyl acrylate); alkyl methacrylates; aryl methacrylates (e.g., methyl acrylate, methyl methacrylate, n-butyl acrylate, n-butyl methacrylate, t-butyl acrylate, t-butyl methacrylate, 2-ethylhexyl methacrylate, benzyl methacrylate and N-phenylacrylamide); alpha-olefins (e.g., ethylene and propylene); and combinations thereof.

Exemplary nitrogenous polymers include poly(acrylamide); poly(methacrylamide); N,N-dialkyl poly(acrylamide) (particularly wherein the nitrogen-bearing substituents are $C_1$–$C_{12}$ alkyl); N,N-dialkyl poly(methacrylamide) (particularly wherein the nitrogen-bearing substituents are $C_1$–$C_{12}$ alkyl); poly(alkoxylated polyamide) (e.g., N-methoxymethylated polyamide and hydroxyethylated polyamide); poly(ε-caprolactam); polypropiolactam; polycapryllactam; polylauryllactam; poly(pyrrolidin-2-one); poly (vinylamine); poly(vinyl pyrrolidone); poly(2-vinylpyridine); poly(3-vinylpyridine); poly(4-vinylpyridine); poly(o-aminostyrene); poly(m-aminostyrene); poly(p-aminostyrene); polyoxazoline; polyethyleneimine; N-alkylated polyethyleneimine (particularly polyethylene imine alkylated with a $C_1$–$C_{12}$ alkyl substituent); N-acylated polyethylene imine (especially where the nitrogen-bearing substituents are $C_1$–$C_{12}$alkyl); poly(p-phenylene terephthalamide); polyetherimides; polyimides; polyurethanes; polyhydrazides; polybenzimidazole; poly(1,2,4-triazole); polyhydantoin; polyimidines; poly(styrene-co-acrylonitrile); poly(butadiene-co-acrylonitrile); and combinations thereof.

Exemplary olefins are $C_{3-20}$ (generally $C_{3-15}$) cyclic olefin monomers such as ethylene, propylene, norbornene and tetracyclododecene.

Exemplary condensation monomers include dicarboxylic acids, their anhydrides and esters; aminocarboxylic acids and lactams; hydroxycarboxylic acids and lactones; diols, polyether diols and polyester diols; and diisocyanates; and combinations thereof.

Exemplary ring-opening monomers include those monomers that contain a 3-carbon carbocyclic ring or a 5-carbon heterocyclic ring (having up to 2 heteroatoms) and include epoxides and norbornenes.

Exemplary imides include those polyamides formed by imidization of a poly(amic acid ester) which is formed from a dianhydride selected from the group consisting of pyrometallic dianhydride, benzophenone dianhydride and 9,9-bis-(trifluoromethyl) xanthenetetracarboxylic dianhydride; and a diamine selected from the group consisting of p-phenylene diamine, 4,4'-diamino-diphenyl ether, 1,3-bis(p-aminophenoxy) benzene and 2,2-bis[4-aminophenyl]hexa-fluoropropane.

Exemplary arylenes include phenylenes, phenylquinoxalines, arylene ethers and combinations thereof.

Exemplary vinyl and vinyl derivatives include vinyl acetate, vinyl bromide, vinylidene chloride, butylacrylate unsubstituted styrene and styrene substituted with one or two lower alkyl, halogen or hydroxyl groups (e.g., styrene derivatives such as 4-vinyltoluene, 4-vinylphenol, α-methylstyrene, 2,5-dimethylstyrene, 4-t-butylstyrene and 2-chlorostyrene); and combinations thereof.

Exemplary organic polysilicas include silsesquioxanes (polymeric silicate materials of the type $(RSiO_{1.5})_n$ where R is an organic substituent); alkoxy silanes (particularly, partially condensed alkoxysilanes, e.g., partially condensed by controlled hydrolysis of tetraethoxysilane having an Mn of about 500 to 20,000); organically modified silicates having the composition $RSiO_3$ and $R_2SiO_2$ wherein R is an organic substituents; and orthosilicates (particularly, partially condensed orthosilicates having the composition $SiOR_4$); and combinations thereof.

Crosslinkable Groups

The synthetic polymer molecules used in the methods of the invention have a plurality of crosslinkable groups that are inert until activated, but which when activated undergo a rapid and irreversible intramolecular crosslinking reaction. In order to perform well in the pseudo-high dilution methods of the invention, the crosslinking groups must react at a rapid rate, the crosslinking chemistry must be irreversible and the resulting coupled structure must be unreactive under the conditions required for crosslinking. Accordingly, the crosslinking groups are referred to as "crosslinkable" since they are inert until activated, but which when activated undergo an irreversible intramolecular crosslinking reaction.

There are numerous crosslinkable groups that are suitable for use in the instant invention and they are typically covalently bound to one or more monomer units within a given polymer molecule. They can be directly bound to the monomers or indirectly bound, such as through a linking group. The crosslinkable groups can be thermally activatible; photolytically activatible; activatible with ultraviolet radiation, ionizing radiation, or electron beam radiation; or activatible by a chemical activating agent. The number of crosslinkable groups on the polymer molecules can be is selected to provide a crosslinked particle of suitable size, with the number of crosslinkable groups being inversely related to the particle size since a larger number of groups will provide for more intramolecular crosslinking and thus a smaller particle. For example, the number of crosslinkable groups can be selected so as to provide particles that are approximately 2–100 nm in diameter. In other embodiments, the desired particle diameter may be within the range of 2–25 nm, or about 2–10 nm, and the number of crosslinkable groups can be selected accordingly. In a similar manner, the crosslinking density on the polymer molecules can be selected so as to provide the desired particle diameter, for example, within the range of about 2–100 nm, about 2–25 nm or about 2–10 nm.

Exemplary crosslinkable groups include by way of illustration and not limitation, acryloyl, lower alkyl-substituted acryloyl, vinyl, substituted vinyl, cyclic ether, cyclic ester, activated ester, cycloalkenyl, acid halide, amino, alcohol, phenol, carboxylic acid, diacetylene, unsubstituted and substituted acetylene groups (e.g., optionally substituted with one or more alkyl, aryl, ester, acid or amide groups), eonophiles, dienophiles and substituted and unsubstituted bicyclo[4.2.0]octa-1,3,5-trienyl groups. A particularly suitable crosslinkable group is the benzocyclobutene fuictionality and its substituted derivatives (especially oxy substituted), a group which has found wide use as a thermally cross-linkable group and in the formulation of thermosetting materials.

Specific examples of suitable crosslinkable groups include —CH=$CH_2$, —C≡CH, —O(CO)—CH=$CH_2$, —O(CO)—C(alkyl)=$CH_2$ (for example, —O(CO)—C (lower alkyl)=$CH_2$), —$(CH_2)_m$—O(CO)—CH=$CH_2$, —$(CH_2)_m$—O(CO)—C(alkyl)=$CH_2$ (for example, —$(CH_2)_m$—O(CO)—C(lower alkyl)=$CH_2$), —(CO) —O—CH=$CH_2$, —O—CH=$CH_2$, —C($CH_3$)=$CH_2$, —C($CF_3$)=$CH_2$, —C($CH_2CH_3$)=$CH_2$, —C($CH_2CF_3$)=$CH_2$, —C($C_6H_5$)=$CH_2$, —C=CH($C_6H_5$), —C≡C ($C_6H_5$), —$(CH_2)_m$—CH=$CH_2$, —$(CH_2)_m$—O—CH=$CH_2$, —$(CH_2)_m$—(CO)—O—CH=$CH_2$, —$(CH_2)_m$—C ($CH_3$)=$CH_2$, —$(CH_2)_m$—C($CF_3$)=$CH_2$, —$(CH_2)_m$—C ($CH_2CH_3$)=$CH_2$, —$(CH_2)_m$—C($CH_2CF_3$)=$CH_2$, —$(CH_2)_m$—C($C_6H_5$)=$CH_2$. Other suitable crosslinkable groups include the following:

where m is an integer in the range of 1 to 12, and "alk" is alkyl, preferably $C_{1-6}$alkyl.

Solvents

Some embodiments of the methods of the invention utilize solvents and there are numerous solvents that are well suited for use in the invention. Preferably, the solvent is inert with respect to the polymer molecules and the produced crosslinked particles.

High boiling point solvents can be used. These include, by way of illustration and not limitation, benzyl ether; N-cyclohexylpyrrolidinone; N-methylpyrrolidone; dimethylacetamide; dimethylphenyl urea; N,N-dimethyltrimethylene urea; butyl acetate; 2-ethoxyethanol; cyclopentanone; cyclohexanone; γ-butyrolactone; lactate esters such as ethyl lactate; ethoxyethylpropionate; alkylene glycol alkyl ether esters such as propylene glycol methyl ether acetate; alkylene glycol alkyl ethers such as propylene glycol methyl ether and propylene glycol n-propyl ether; alkylene glycol monoalkyl esters such as methyl cellosolve, butyl acetate, 2-ethoxyethanol, and ethyl 3-ethoxypropionate; polyethylene glycols and alkyl and aryl derivatives; diphenyl ether; diphenyl sulfone; ethylene carbonate; and mixtures thereof.

In addition, there are numerous other common organic solvents that can be utilized. These include, by way of illustration and not limitation, p-xylene, toluene, anisole, mesitylene, 1,3-dimethoxybenzene, trichloroethylene; and mixtures thereof.

Coupling Agents

It may be desirable to include a coupling agent in the methods of the invention and there are numerous suitable coupling agents that are known in the art. These include, by way of illustration and not limitation, esters, dihaloalkanes such as 1,2-dibromoethane, iodine, bis(bromomethyl)benzene, silicon tetrachloride and tin tetrachloride, di(isopropenyl)benzene and divinyl benzene, alkyltrichlorosilanes and dialkyldichlorosilanes. Selection of the appropriate coupling agent will be determined by the monomers used and/or the nature of the polymer being synthesized as is well known in the art.

Chemical Moieties

The incorporation of various chemical moieties allows for the preparation of tailored nanoparticles. The chemical moiety can be attached to the preformed polymer molecule or it can be attached to the particle during its formation. In the latter case, the activation step can be conducted in the presence of a chemical moiety so that the chemical moiety is incorporated into the crosslinked particle. For example, the crosslinked particle can have at least one functional group on its backbone so that the chemical moiety is covalently attached to the crosslinked particle at the functional group.

Such chemical moieties include, by way of illustration, pharmaceutical agents, catalysts, functional groups, surfactants, sensor groups and photoresponsive units. For example, the polymer molecule can be prepared by first preparing a short carboxy-functionalized polystyrene block, which is then used to initiate the polymerization of a mixture of styrene and vinylbenzocyclobutene. The resulting polymer can then be used as a starting material in the preparation of crosslinked nanoparticles, in which a single carboxy functional group and linear block are now attached. The versatility inherent in the synthesis again allows the length of the linear block, nature of the repeat units and the number of functional groups to be easily varied.

Exemplary pharmaceutical agents include peptides, DNA oligomers, lipids, enzymes, carbohydrates and aminoglycosides.

Exemplary catalysts include metals, acids, bases, oxidizing and reducing agents and chelating groups.

Exemplary functional groups include acids, esters, alcohols, phenols, amines, thiols, amides, imines, nitrites, ethers, acetylenes, alkenes and heterocyclics.

Methods

In one embodiment of the invention, crosslinked particles are prepared by the following steps: (a) providing synthetic polymer molecules having a plurality of crosslinkable groups that are inert until activated, but which when activated undergo an irreversible intramolecular crosslinking reaction; and (b) activating the crosslinkable groups under crosslinking conditions, whereby irreversible intramolecular crosslinking of the polymer molecules occurs to form crosslinked particles.

The term "rapid" is intended to mean that the intramolecular crosslinking of each polymer molecule occurs at such a rate so as to substantially prevent intermolecular crosslinking among polymer molecules. In addition, the term "substantially" is used to indicate that an insignificant amount of intermolecular crosslinking occurs between the synthetic polymer molecules. "Insignificant" is intended to mean about less than about 10%, preferably less than about 5%, more preferably less than about 1% of the polymer molecules participate in intermolecular crosslinking.

The crosslinked particles produced by the methods of the invention are preferably inert under the crosslinking conditions with respect to intermolecular crosslinking with the polymer molecules. In addition, the crosslinked particles are preferably inert under the crosslinking conditions with respect to intermolecular crosslinking with each other. This inert characteristic can serve to minimize or prevent the particles from further reaction after they have formed.

In one preferred embodiment of the invention, the crosslinked particles are randomly formed. By "randomly" it is meant that the probability of forming a given crosslinked particle is independent of the nature and position of the crosslinkable groups on the synthetic polymer molecule.

In some embodiments of the invention, it may be desirable to conduct the activation step in solution. For example, the polymer molecules can be added to a solvent prior to activation of the crosslinkable groups to form a polymer molecule solution, such that the crosslinkable groups are activated in the solvent and the crosslinked particles are formed therein. This is particularly useful when the crosslinkable group is a chemically activatible. For example, the activation step (b) can be carried out by slowly adding a chemical activation group to the polymer molecule solution so as to promote intramolecular crosslinking. The use of a solvent is also useful when a coupling agent is used. For example, the step (b) can be carried out by slowly adding a coupling agent to the polymer molecule solution so as to promote intramolecular crosslinking. The term "slowly" is intended to mean that the chemical activation group or coupling agent will be added at a rate such that the inert crosslinkable groups are slowly activated or unmasked and in low concentration.

In those methods where a solvent is utilized, both the polymer molecules and the crosslinkable groups thereon can be selected so as to produce crosslinked particles having desirable hydrodynamic volume characteristics. For example, in one embodiment, the polymer molecules and crosslinkable groups are selected so that the hydrodynamic volume of the resulting crosslinked particles in the solvent is up to about 80% less than the hydrodynamic volume of the polymer molecules prior to crosslinking. In a preferred embodiment, the hydrodynamic volume of the crosslinked particles is about 5–60% less than the hydrodynamic volume of the polymer molecules prior to crosslinking. In another embodiment, the hydrodynamic volume of the particle is about 35–50% less than the hydrodynamic volume of the polymer molecules prior to crosslinking. Smaller volume changes (about 5–30%) are achievable using functionalized branched polymers, stars, hyperbranched or dendritic macromolecules.

In another embodiment of the invention, crosslinked particles are prepared as follows: (a) providing the synthetic polymer molecules having a plurality of crosslinkable groups; and (b) activating the crosslinkable groups under conditions that are effective to promote intramolecular crosslinking reactions. These conditions are also selected so as to be effective to substantially prevent intermolecular crosslinking between the polymer molecules. In this manner, activation provides for the formation of a single crosslinked particle from a single corresponding polymer molecule. In some instances, a single crosslinked particle may be formed when two or more polymer molecules undergo intermolecular crosslinking. However, as noted above, the amount of such intermolecular crosslinking is insignificant and thus the majority of particles formed by the methods of the invention will have molecular weights that are substantially the same as the starting polymer molecule material.

The methods of the invention provide for a final concentration of crosslinked particles in the mixture of typically greater than about 0.5 wt %. In preferred embodiments, the concentration of crosslinked particles in the mixture is greater than about 5 wt %, and more preferably greater than about 20 wt %. The methods of the invention can also include an isolation step, where the crosslinked particles can be isolated for placement in storage or for further use. Isolation involves the removal of any solvent by known techniques as well as the removal of any excess polymer molecules, coupling agents, activating agents and so forth, by methods that are well known in the art.

Another embodiment of the invention relates to a solvent based method where crosslinked particles are prepared by: (a) providing the synthetic polymer molecules having a plurality of crosslinkable groups; (b) activating the crosslinkable groups; and (c) adding the synthetic polymer molecules to a solvent under conditions effective to allow irreversible intramolecular crosslinking reaction to take place while substantially preventing intermolecular reaction. As with the methods described above, this results in the formation of a single crosslinked particle from a corresponding polymer molecule.

The activation step (b) can be carried out prior to, during or subsequent to the adding step (c). In addition, the method can also involve repeating steps (a), (b) and (c) without diluting the solvent or removing the resulting crosslinked particles.

The synthetic polymer molecules can be provided in solution in step (a), using any of the aforementioned solvents. Preferably, the polymer solution will be at a sufficiently dilute concentration so as to substantially prevent intermolecular reactions following activation of the crosslinking groups.

The synthetic polymer molecules can be added to the solvent slowly in step (c) so as to substantially prevent intermolecular crosslinking between the polymer molecules relative to the rate at which the intramolecular crosslinking reaction occurs. Similarly, if the synthetic polymer molecules are provided in a solution, then the adding step (c) can involve slowly adding the polymer molecule solution to the solvent so as to substantially prevent intermolecular crosslinking between the polymer molecules.

Activation of the Crosslinkable Groups

When the crosslinkable group used is thermally activatible, the activation step is carried out by heating the polymer molecules. For example, the polymer molecules can be added to a solvent that is maintained at a temperature sufficiently high to activate the crosslinkable groups, i.e., at a temperature effective to activate the crosslinkable groups. When the crosslinkable group is photolytically activatible, the activation step involves irradiating the polymer molecule with photon energy.

For crosslinkable groups that are activatible with ultraviolet radiation, ionizing radiation, or electron beam radiation, activation is accomplished by exposing the polymer molecule to the appropriate radiation. For example, the polymer molecules can be slowly added to an irradiated solvent so as to promote intramolecular crosslinking.

For crosslinkable groups that are activatible by a chemical activating agent, activation is attained by contacting the polymer molecule with an appropriate chemical activating agent. For example, the chemical activating agent can be slowly added to the polymer molecule to promote intramolecular crosslinking.

There are numerous chemical activating agents that are suitable for use in the instant invention, and they include, by way of illustration and not limitation, free radical initiators, acids, bases, organic catalysts, organometallic catalysts, metallic catalysts, nucleophiles and electrophiles.

Suitable free radical initiator activating agents include di (trichloromethyl) stibenyl triazine, 1,1,1-trichloro-t-butyl acetophenones, peroxides, peresters, azo initiators and oxygen.

Suitable acid activating agents include strong acids such as alkyl and aryl sulphonic acids, trihaloacetic acids, Lewis acids and hydrogen halide acids.

Suitable base activating agents include inorganic hydroxides and alkoxides, organic amines and ammonia, phosphoramides, phenoxides and inorganic carbonates.

Suitable organic catalyst activating agents include phosphines, arsines, mercaptans, thioesters, thiocarbonates, oxazoles, imidazoles, thiazoles, heterocyclic carbenes and alcohols.

Suitable organometallic catalyst activating agents include ruthenium, tungsten, molybdenum complexes, complexes of Rh, Ni, Pd, Pt, Sn and rare earths.

Suitable metallic catalyst activating agents include Ag, Cu, Ni, Co, Pd, Mg, Zn, alkali and alkaline earth metals.

Suitable nucleophile activating agents include mercaptans, azoles, inorganic halides, phenoxides, thiophenoxides, carbon nucleophiles, carboxylic acid salts and ammonium salts.

Suitable electrophile activating agents include halogens, ketenes, isocyanates, isothiocyanates, carbodiimides, anhydrides, acid halides, silyl derivatives, alkyl halides, sulfonates and triflates.

One use for the crosslinked particles of the invention is in the formation of a matrix, and in particular a dielectric matrix. Preferably, the decomposition temperature of the crosslinked particles is less than the decomposition temperature of the host matrix material such that the matrix, once formed, can be heated to the decomposition temperature of the crosslinked particles. In this manner, the crosslinked particles decompose to create a porous matrix. Ideally the particles should become attached to the matrix upon curing to limit domain growth during processing. This can occur either through functionality contained on the particle and matrix or by the addition of an appropriate coupling reagent which can join the matrix and particle during curing. The coupling reagent can be specifically tailored to the functionality of the host and particle. Suitable coupling reagents are obvious to those skilled in the art and are described in U.S. Pat. No. 6,107,357 to Hawker, et al, which is incorporated herein by reference. Exemplary host matrix materials include high temperature thermoplastic polymers such as polyimides, polybenzazoles, polyarylenes, polyarylene ethers and polyquinolines. Also useful are high temperature thermosets such as silsesquioxanes, sol-gel silicates, epoxy resins, isocyanates, polyacetylenes, polyarylenes and polyarylene ethers. Thermosetting may be induced thermally or by the use of catalysts.

Polymer-based dielectric materials like those noted above can often provide lower dielectric constants than inorganic materials. Unfortunately, it has been difficult to manufacture organic dielectric matrices having a small pore size. By using the crosslinked particles of the invention in combination with organic matrix host materials, a porous organic dielectric matrix is obtained having closed cell pores whose diameters fall substantially in the range of 2–25 nm, and more preferably within the range of 2–10 nm. Integrated circuits can then be made from this dielectric matrix, once patterned and combined with a planarized metallic film. As used herein in relation to particle size, the term "substantially" is intended to mean that a significant number of pores have diameters within the designated range. "Significant" is intended to mean greater than about 90%, preferably greater than about 95%, more preferably greater than less than about 99% of the pores.

Of particular interest is the use of organic materials such as the SiLK brand (Dow Chemical) semiconductor dielectric resins as the host matrix material. Exemplary SiLK materials include polyphenylene oligomers and polymers as described in U.S. Pat. No. 5,965,679 and U.S. Pat. No. 6,288,188, both to Godschalx, et al., the disclosures of which are incorporated herein by reference. These materials are oligomers, uncured polymers or cured polymers that are reaction products of one or more polyfunctional compounds containing two or more cyclopentadienone groups and at least one polyfunctional compound containing two or more aromatic acetylene groups, where at least one of the polyfunctional compounds contain three or more reactive groups such as acetylene groups and cyclopentadienone groups.

Use of the crosslinked particles to prepare a dielectric composition provides for a porous polymeric matrix with a number of advantageous properties. The matrix has a dielectric constant ("k") of less than 3.0, preferably less than 2.8, most preferably less than 2.5, at 25° C. In addition, the matrix has closed cell pores generally less than about 25 nm (i.e., less than about 250 Å), preferably less than about 10 nm (i.e., less than about 100 Å) in diameter. The matrix generally has a void percentage in the range of approximately 5–35%, resulting in enhanced mechanical toughness and crack resistance and improved isotropic optical properties. The dielectric composition also has a low thermal expansion coefficient at elevated temperatures (e.g., less than about 100 ppm, preferably less than about 40 ppm, more preferably less than about 30 ppm), which assists in avoiding film cracking during thermal processing. Further, the dielectric composition has mechanical properties that enable it to be chemically/mechanically planarized to facilitate lithographic formation of multiple circuit levels in multilevel integrated circuit devices. The dielectric composition is optically clear and adheres well to substrates.

Dielectric compositions manufactured using the crosslinked particles of the invention find particular utility in the manufacture of electronic devices, particularly integrated circuit devices. An integrated circuit device according to the present invention is exemplified in FIG. 1, wherein the device is shown as comprising substrate 2, metallic circuit lines 4, and a dielectric material 6 of the instant invention. The substrate 2 has vertical metallic studs 8 formed therein. The circuit lines function to distribute electrical signals in the device and to provide power input to and signal output from the device. Suitable integrated circuit devices generally comprise multiple layers of circuit lines that are interconnected by vertical metallic studs.

Figure 1:
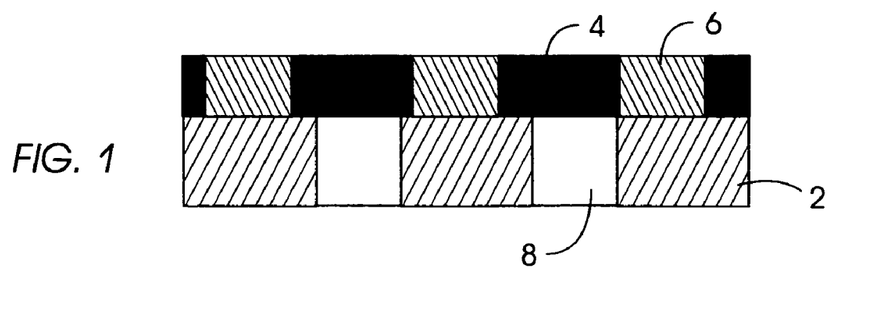
FIG. 1 is a cross-sectional view of a portion of an integrated circuit device fabricated using a porous dielectric matrix formed using the crosslinked particles provided herein.

Suitable substrates 2 comprise silicon, silicon dioxide, silicon-germanium, glass, silicon nitride, ceramics, aluminum, copper, and gallium arsenide. Suitable circuit lines generally comprise a metallic, electrically conductive material such as copper, aluminum, tungsten, gold or silver, or alloys thereof. Optionally, the circuit lines may be coated with a metallic liner such as a layer of nickel, tantalum or chromium, or with other layers such as barrier or adhesion layers (e.g., SiN, TiN, or the like).

Figure 2:
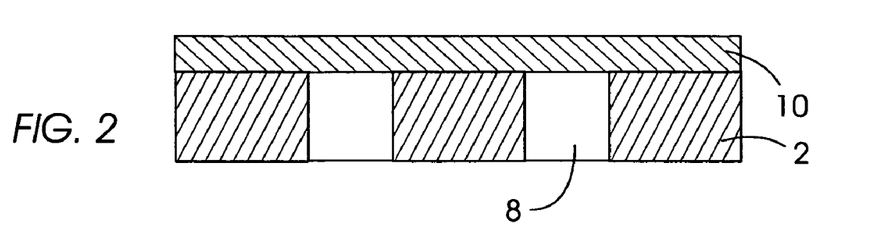
FIGS. 2–5 schematically illustrate a process for making an integrated circuit device using the present dielectric matrix.

The invention also relates to processes for manufacturing integrated circuit devices containing a dielectric composition as described herein. Referring to FIG. 2, the first step of one process embodiment involves disposing on a substrate 2 a layer 10 of a mixture of (i) the crosslinked particles of the invention and a host matrix material, as described above. The admixture is applied to the substrate by methods recognized in the art such as spin or spray coating or doctor blading. The layer 10 is heated to a temperature effective to decompose the crosslinked particles and thus bring about conversion of layer 10 to a dielectric composition of the invention.

Figure 3:
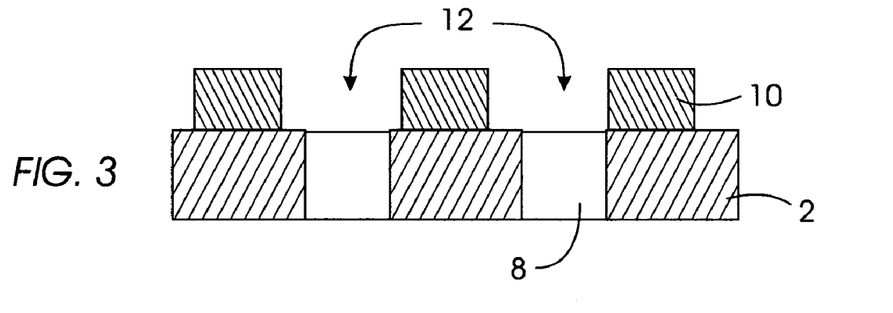

Referring to FIG. 3, the second step of the process involves lithographically patterning the layer 10 of dielectric composition to form trenches 12 (depressions) therein. The trenches 12 shown in FIG. 3 extend to the substrate 2 and to the metallic studs 8. Lithographic patterning generally involves: (i) coating the layer 10 of the dielectric composition with a positive or negative photoresist such as those marketed by Shipley or Hoechst Celanese, (AZ photoresist); (ii) imagewise exposing (through a mask) the photoresist to radiation such as electromagnetic, e.g., UV or deep UV; (iii) developing the image in the resist, e.g., with suitable basic developer; and (iv) transferring the image through the layer 10 of dielectric composition to the substrate 2 with a suitable transfer technique such as reactive ion blanket or beam etching. Suitable lithographic patterning techniques are well known to those skilled in the art such as disclosed in Introduction to Microlithography, 2nd Ed., eds. Thompson et al. (Washington, D.C.: American Chemical Society, 1994).

Figure 4:
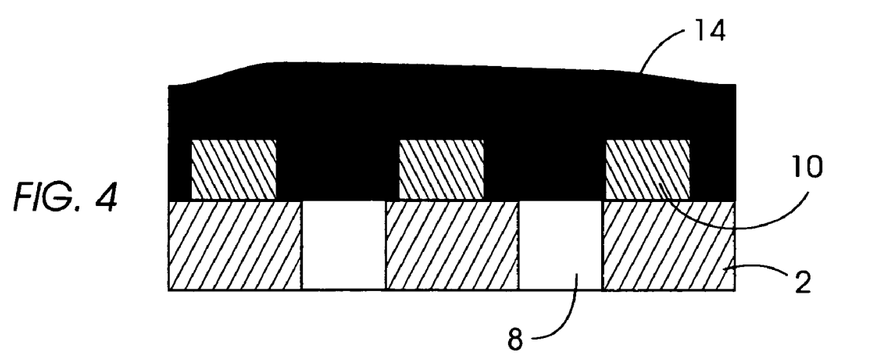

Referring to FIG. 4, in the third step of the process for forming an integrated circuit of the present invention, a metallic film 14 is deposited onto the patterned dielectric layer 10. Preferred metallic materials include copper, tungsten, and aluminum. The metal is suitably deposited onto the patterned dielectric layer by art-known techniques such as chemical vapor deposition ("CVD"), plasma-enhanced CVD, electro and electroless deposition (seed-catalyzed in situ reduction), sputtering, or the like.

Figure 5:
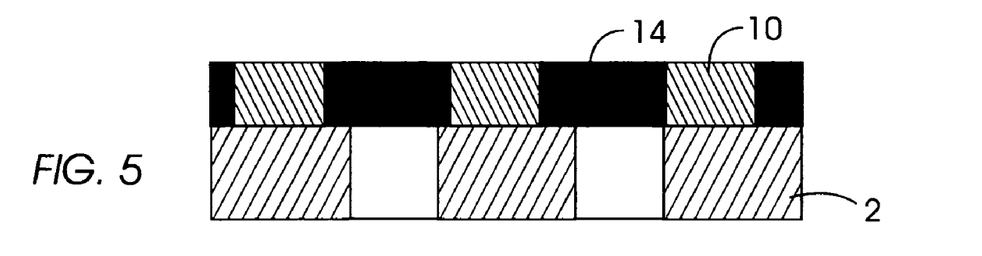

Referring to FIG. 5, the last step of the process involves removal of excess metallic material by "planarizing" the metallic film 14 so that the film is generally level with the patterned dielectric layer 10. Planarization can be accomplished using chemical/mechanical polishing or selective wet or dry etching. Suitable methods for chemical/mechanical polishing are known to those skilled in the art.

Figure 6:
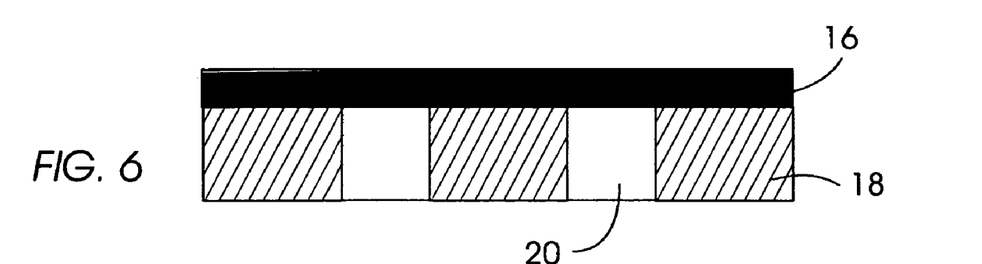
FIGS. 6–8 schematically illustrate an alternative process for making an integrated circuit device using the present dielectric matrix.
Figure 7:
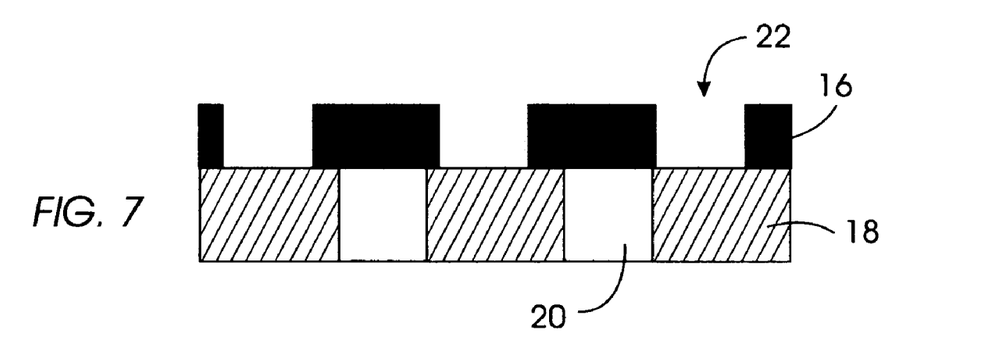
Figure 8:
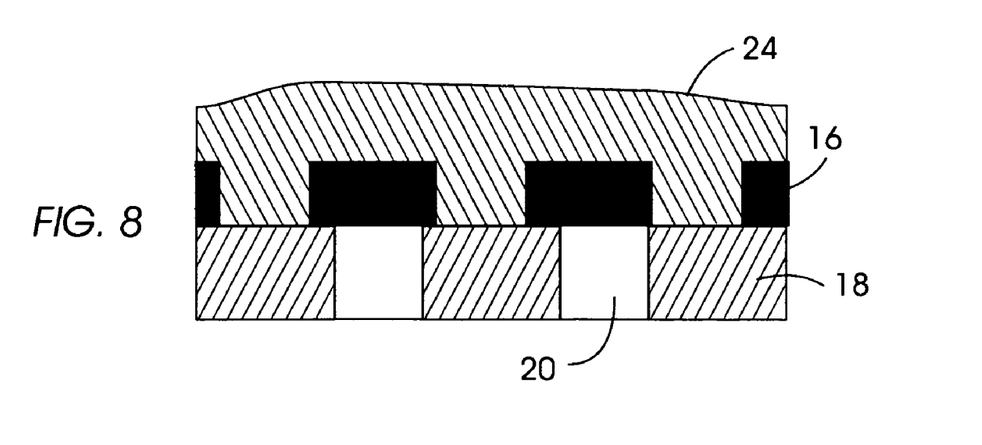

Referring to FIGS. 6–8, there is shown an alternative process for making an integrated circuit device of the invention. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the third step of the process, a layer 24 of a the crosslinked particles of the invention and a host matrix material is deposited onto the patterned metallic film 16. In the last step of the process, the mixture is heated to decompose the crosslinked particles. Optionally, the dielectric layer so provided may then be planarized, if necessary, for subsequent processing in a multilayer integrated circuit.

The invention additionally relates to an integrated circuit packaging device (multichip module) for providing signal and power current to one or more integrated circuit chips comprising: (i) a substrate having electrical conductor means for connection to a circuit board, (ii) a plurality of alternating electrically insulating and conducting layers positioned on the substrate wherein at least of the layers comprises a film of a dielectric material of the present invention; and (iii) a plurality of vias for electrically interconnecting the electrical conductor means, conducting layers and integrated circuit chips.

The integrated circuit packaging device represents an intermediate level of packaging between the integrated circuit chip and the circuit board. The integrated circuit chips are mounted on the integrated circuit packaging device which is in turn mounted on the circuit board.

The substrate of the packaging device is generally an inert substrate such as glass, silicon or ceramic; suitable inert substrates also include epoxy composites, polyimides, phenolic polymers, high temperature polymers, and the like. The substrate can optionally have integrated circuits disposed therein. The substrate is provided with electrical conductor means such as input/output pins (I/O pins) for electrically connecting the packaging device to the circuit board. A plurality of electrically insulating and electrically conducting layers (layers having conductive circuits disposed in an dielectric insulating material) are alternatively stacked up on the substrate. The layers are generally formed on the substrate in a layer-by-layer process wherein each layer is formed in a separate process step.

The packaging device also comprises receiving means for receiving the integrated circuit chips. Suitable receiving means include pinboards for receipt of chip I/O pins or metal pads for solder connection to the chip. Generally, the packaging device also comprises a plurality of electrical vias generally vertically aligned to electrically interconnect the I/O pins, the conductive layers and integrated circuit chips disposed in the receiving means. The function, structure and method of manufacture of such integrated circuit packaging devices are well known to those skilled in the art, as disclosed, for example in U.S. Pat. Nos. 4,489,364, 4,508, 981, 4,628,411 and 4,811,082.

The following examples are put forth so as to provide those of ordinary skill in the art with a complete disclosure and description of how to prepare and use the oligomers and polymers disclosed and claimed herein. Unless indicated otherwise, parts are parts by weight, temperature is in ° C. and pressure is at or near atmospheric.

EXAMPLES

Commercial reagents were obtained from Aldrich and used without further purification. Analytical TLC was performed on commercial Merck plates coated with silica gel GF254 (0.24 mm thick). Silica gel for flash chromatography was Merck Kieselgel 60 (230–400 mesh, ASTM). Nuclear magnetic resonance was performed on a Bruker AM 200 FT-NMR spectrometer using deuterated solvents and the solvent peak as a reference. Gel permeation chromatography was performed in THF on a Waters chromatograph equipped with four 5-μm Waters columns (300×7.7 mm) connected in series with increasing pore size (100, 1000, 100,000, 1,000,000 A). A Waters 410 differential refractometer and a 996 photodiode array detector were employed. The polystyrene molecular weights were calculated relative to linear polystyrene standards, whereas the poly(n-butyl acrylate) molecular weights were calculated relative to poly(n-butyl acrylate) standards.

Abbreviations

BCB Benzocyclobutene
nBuLi n-Butyl lithium
DCM Dichloromethane
DMF N,N-dimethylformamide
MeOH Methanol
PD Polydispersity index
THF Tetrahydrofuran
RT Room Temperature
SEC Size Exclusion Chromatography Example 1

Synthesis of the 4-Vinyl-Benzocyclobutene Monomer (3)

4-Formaldehyde-Benzocylobutene (2)

To a 500 ml flask was added 50 ml dry THF and 2.88 g (120 mmol) Mg turnings with 4 drops of dibromoethane. The reaction mixture was then heated under reflux for 15 min, 20 g (108 mmol) of 4-bromobenzocyclobutene (1) diluted in 25 ml THF was added via dropping funnel to the Grignard reagent. After addition and rinsing the dropping funnel with 25 ml of dry THF, the reaction mixture was heated for an additional 45 min under reflux to give a green brown solution. The reaction mixture was allowed to cool to RT and then cooled down to 0° C., 15 ml (210 mmol) of DMF was added dropwise to the solution and the reaction mixture was heated under reflux for another 15 min. The reaction mixture was poured onto 150 g of ice, acidified to pH=4 and neutralized with sat. NaHCO₃ solution. The crude product was extracted with ethyl acetate, the organic phase was filtered over celite and evaporation of the solvent gave the crude product (2). The product was isolated by column chromatography using 10% diethylether/hexane as eluting solvents and was finally purified by Kugelrohr distillation. Yield: 81% of a colorless liquid (2).

$^1$H-NMR (250 MHz, CDCl$_3$): 9.9 (s, 1H, CHO), 7.65 (dd, 1H, J=7.4 Hz, J'=1.2 Hz, ArH), 7.50 (s, 1H, ArH), 7.14 (dd, 1H, J=7.4 Hz, J'=1.2 Hz, ArH), 3.15 (s, 4H, CH$_2$).

4-Vinyl-Benzocyclobutene (3)

To a 500 ml round bottom neck flask was added 24.3 g (68.1 mmol) (Ph)$_3$PCH$_3$Br and 110 ml dry THF and cooled to −78° C. 26.4 ml (66 mmol) of nBuLi (2.5 M in hexane) was added dropwise and the reaction mixture was allowed to warm to RT. The yellow-orange solution was cooled to −78° C. again and 7.16 g (54.2 mmol) of Compound 2, diluted in 34 ml dry THF was added slowly and stirred for another 2 hrs at RT. After completion the reaction was treated sequentially with sat. NH$_4$Cl and sat. NaHCO$_3$ solution. The crude product was filtered over celite and extracted using diethyl ether/hexane (1:1) and evaporation of solvents (no heat) gave the crude product (3). Further purification by column chromatography using 5% diethyl ether/hexane as an eluting solvent followed by a Kugelrohr distillation gave the pure product (3) as a colorless liquid in 78% yield.

$^1$H-NMR (250 MHz, CDCl$_3$): 7.26 (d, 1H, J=7.4 Hz, ArH), 7.20 (s, 1H, ArH), 7.04 (d, 1H, J=7.4 Hz, ArH), 6.74 (dd, 1H, J=17.5 Hz, J'=10.8 Hz, CH), 5.70 (d, 1H, J=17.5 Hz, CH$_2$), 5.20 (d, 1H, J=10.8 Hz, CH$_2$). 3.19 (s, 4H, CH$_2$).

Example 2

Polymers for Nanoparticle Formation

Random Copolymer of Vinyl-Benzocyclobutene with Styrene (90% Styrene/10% BCB (60 K))

The alkoxyamine initiator (4) was dissolved in 540 equivalents of styrene and 60 equivalents of Compound 3 in a glass ampule with a stir bar. After 3 freeze and thaw cycles the ampule was sealed under argon and heated for 9 hours at 125° C. The resulting polymer was dissolved in DCM and purified by precipitation into MeOH to give a colorless powder, $M_n$=57,000; PD=1.10.

$^1$H-NMR (250 MHz, CDCl$_3$): 7.24–6.57 (m, 45H, ArH), 3.05 (bs, 4H, CH$_2$), 1.83–1.26 (m, 39H, CH$_2$, CH).

Random Copolymer of Vinyl-Benzocyclobutene with Styrene (95% Styrene/5% BCB (80 K))

Following a procedure similar to that described above for the 90% Styrene/10% BCB polymer, the instant synthesis (Scheme 2)(provided a 95:5 styrene/BCB random copolymer ($M_w$=80,000; PD=1.11) (6).

Block Copolymer of Vinyl-Benzocyclobutene with Styrene using PEG-Initiator (5) (90% Styrene/10% BCB/10% PEG (60K))

The poly(ethylene glycol) terminated alkoxyamine initiator was dissolved in 540 equivalents of styrene and 60 equivalents of Compound 3 in a glass ampule with a stir bar. After 3 freeze and thaw cycles the ampule was sealed under argon and heated for 3 hours at 125° C. The resulting polymer was dissolved in dichloromethane and purified by precipitation into methanol to give a colorless powder, $M_n$=61,000; PD=1.10.

$^1$H-NMR (250 MHz, CDCl$_3$): 7.24–6.57 (m, 45H, ArH), 3.65 (s, 4H, OCH$_2$), 3.05 (bs, 4H, CH$_2$), 1.83–1.26 (m, 39H, CH$_2$, CH).

Random Copolymer of Vinyl-Benzocyclobutene with n-Butylacrylate

The alkoxyamine initiator was dissolved in 540 equivalents of n-butyl acrylate and 60 equivalents of Compound 3 in a glass ampule with a stir bar. After 3 freeze and thaw cycles the ampule was sealed under argon and heated for 15 hours at 125° C. The resulting polymer was dissolved in DCM and precipitated in MeOH/H$_2$O (3:1) to give a colorless gum, $M_n$=54,000; PD=1.08.

$^1$H-NMR (250 MHz, CDCl$_3$): 6.83–6.63 (m, 3H, ArH), 4.10–3.83 (m, 9H, CH$_2$,CH), 3.05 (bs, 4H, CH$_2$), 2.22–1.01 (m, 55H, CH$_2$, CH$_3$).

Example 3

General Procedure for Nanoparticle Formation

The following outlines the general procedure for the intramolecular crosslinking reaction that provides the nanoparticles of the invention.

20 ml of benzyl ether was heated to 250° C. in a 500 ml 3-necked flask equipped with a internal thermometer, condenser and septum. A solution of the desired benzocyclobutene functionalized linear polymer, dissolved in benzyl ether (40 ml) (1–10 wt % depending on the amount of crosslinking groups), was added via syringe pump at approximately 12.8 ml/hr with vigorously stirring under argon. After addition the solvent was distilled under reduced pressure and the remaining crude product was precipitated into MeOH. The colorless precipitate was filtered off and dried under vacuum.

$^1$H-NMR (250 MHz, CDCl$_3$): The significant change is the disappearance of the benzocylobutene protons at 3.05 on formation of the crosslinked particles.

Example 4

Comparison of Inter-molecular Crosslinking Levels

Following the procedures of traditional high dilution methods, a solution of the 95:5 styrene/BCB random copolymer (6) in benzyl ether was heated in a sealed tube at 250° C. for 8 hours at various concentrations. It was observed that even at very low concentrations (about $2.5 \times 10^{-4}$ M), significant amounts of inter-molecular crosslinking was evidenced by the increase in molecular weight of the resulting nanoparticles. At a concentration of about $9.0 \times 10^{-3}$ M crosslinking to a swollen gel occurred very rapidly (about 1 minute).

While these concentrations are comparable to results obtained with other traditional ultra-high dilution techniques, it is in direct contrast to the pseudo-high dilution strategy of the invention in which a 0.2 M solution of the same starting linear polymer in benzyl ether was continuously fed into benzyl ether heated at 250° C. Under these conditions no crosslinking was observed and minor amounts of intra-molecular crosslinking only became apparent at final overall concentrations of $3.0 \times 10^{-2}$ M, an increase of greater than 2 orders of magnitude when compared to the traditional high dilution strategy.

Example 5

Comparison of Hydrodynamic Volumes

The hydrodynamic volume of nanoparticles decreases on intramolecular crosslinking. The original linear polymer (6) had a molecular weight of 80,000. When subjected to the traditional high dilution method, the polymer underwent a size reduction on intra-molecular crosslinking to give a nanoparticle with a polystyrene equivalent $M_w$ of 65,000, which is approximately a 20% reduction in hydrodynamic volume.

Since the pseudo-high dilution technique of the invention allows for substantially eliminating inter-molecular crosslinking, the techniques provided for an opportunity to evaluate the relationship between hydrodynamic volume and the number of crosslinking groups. Linear polystyrene derivatives were prepared with the same molecular weight, however they differed in the level of BCB incorporation, ranging from 2.5 to 20 mole percent. The change in hydrodynamic volume observed was dramatic and an almost linear relationship between the level of BCB incorporation and the final size of the nanoparticle was obtained.

Example 6

Polymer Molecule-to-Crosslinked Particle Ratio

The methods of the invention provide for accurate control of the size and functionality of the nanoparticle by increasing the length of the initial linear polymer or by the inclusion of functional groups. A 90/10 styrene/BCB random copolymer was prepared with a molecular weight, $M_n$=270,000 and PD=1.13. After intra-molecular crosslinking, this polymer molecule yielded a single molecule nanoparticle with a polystyrene molecular weight of 110,000 and PD=1.08. This represents an approximate 60% reduction in size due to the presence of about 140 intramolecular crosslinks per nanoparticle/molecule and the absence of inter-molecular crosslinking. The low dispersity of the final nanoparticle was observed on comparison of the SEC traces of the starting material (polymer) and the product (crosslinked particle).

Each of the patents, publications, and other published documents mentioned or referred to in this specification is herein incorporated by reference in its entirety.

While the present invention has been described with reference to the specific embodiments thereof, it should be understood by those skilled in the art that various changes may be made and equivalents may be substituted without departing from the scope of the invention. In addition, many modifications may be made to adapt a particular situation, material, composition of matter, process, process step or steps, while remaining within the scope of the present invention. Accordingly, the scope of the invention should therefore be determined with reference to the appended claims, along with the full range of equivalents to which those claims are entitled.

We claim:

1. A method for preparing crosslinked particles, comprising:
   (a) providing synthetic polymer molecules having a plurality of crosslinkable groups that are inert until activated, but which when activated undergo an irreversible intramolecular crosslinking reaction; and
   (b) activating the crosslinkable groups under crosslinking conditions, whereby irreversible intramolecular crosslinking of the polymer molecules occurs to form crosslinked particles.

2. The method of claim 1 wherein the crosslinked particles are inert under said crosslinking conditions with respect to intermolecular crosslinking with said polymer molecules.

3. The method of claim 1 wherein the crosslinked particles are inert under said crosslinking conditions with respect to intermolecular crosslinking with each other.

4. The method of claim 1 wherein the polymer molecules are added to a solvent prior to activation of the crosslinkable groups to form a polymer molecule solution, such that the crosslinkable groups are activated in the solvent and the crosslinked particles are formed therein.

5. The method of claim 4 wherein (b) is carried out by slowly adding a coupling agent to the polymer molecule solution so as to promote intramolecular crosslinking.

6. The method of claim 4 wherein the polymer molecules and the crosslinkable groups thereon are selected so that hydrodynamic volume of the crosslinked particles in the solvent is up to about 80% less than hydrodynamic volume of the polymer molecules prior to crosslinking.

7. The method of claim 6 wherein the hydrodynamic volume is about 5–60% less than the hydrodynamic volume of the polymer molecules prior to crosslinking.

8. The method of claim 7 wherein the hydrodynamic volume is about 35–50% less than the hydrodynamic volume of the polymer molecules prior to crosslinking.

9. The method of claim 7 wherein the hydrodynamic volume is about 5–30% less than the hydrodynamic volume of the polymer molecules prior to crosslinking.

10. The method of claim 1 wherein the crosslinkable groups are thermally activatible, and (b) is carried out by heating the polymer molecule.

11. The method of claim 10 wherein (b) is carried out by adding the polymer molecules to a solvent maintained at a temperature sufficiently high to activate the crosslinkable groups.

12. The method of claim 1 wherein the crosslinkable groups are photolytically activatible, and (b) is carried out by irradiating the polymer molecule.

13. The method of claim 1 wherein the crosslinkable groups are activatible with ultraviolet radiation, ionizing radiation, or electron beam radiation.

14. The method of claim 13 wherein (b) is carried out by slowly adding the polymer molecules to an irradiated solvent so as to promote intramolecular crosslinking.

15. The method of claim 1 wherein the crosslinkable groups are activatible by a chemical activating agent, and (b) is carried out by contacting the polymer molecules with the chemical activating agent.

16. The method of claim 15 wherein (b) is carried out by slowly adding the chemical activating agent to the polymer molecules so as to facilitate intramolecular crosslinking.

17. The method of claim 15 wherein (b) is carried out by slowly adding the polymer molecules to the chemical activating agent so as to facilitate intramolecular crosslinking.

18. The method of claim 15 wherein the chemical activating agent is selected from the group consisting of free radical initiators, acids, bases, organic catalysts, organometallic catalysts, metallic catalysts, nucleophiles and electrophiles.

19. The method of claim 1 wherein the molecular weight of the polymer molecules is selected to provide crosslinked particles approximately 2 nm to 100 nm in diameter.

20. The method of claim 19 wherein the molecular weight of the polymer molecules is selected to provide crosslinked particles approximately 2 nm to 25 nm in diameter.

21. The method of claim 20 wherein the molecular weight of the polymer molecules is selected to provide crosslinked particles approximately 2 nm to 10 nm in diameter.

22. The method of claim 1 wherein the number of crosslinkable groups on the polymer molecules is selected to provide a crosslinked particle approximately 2 nm to 100 nm in diameter.

23. The method of claim 22 wherein the number of crosslinkable groups on the polymer molecules is selected to provide a crosslinked particle approximately 2 nm to 25 nm in diameter.

24. The method of claim 23 wherein the number of crosslinkable groups on the polymer molecules is selected to provide a crosslinked particle approximately 2 nm to 10 nm in diameter.

25. The method of claim 1 wherein crosslinking density on the polymer molecules is selected to provide a crosslinked particle approximately 2 nm to 100 nm in diameter.

26. The method of claim 25 wherein the crosslinking density on the polymer molecules is selected to provide a crosslinked particle approximately 2 mm to 25 nm in diameter.

27. The method of claim 26 wherein the crosslinking density on the polymer molecules is selected to provide a crosslinked particle approximately 2 nm to 10 nm in diameter.

28. The method of claim 1 wherein the polymer molecules are linear.

29. The method of claim 1 wherein the polymer molecules are branched.

30. The method of claim 29 wherein the polymer molecules are star polymers, hyperbranched polymers, graft polymers or dendritic polymers.

31. The method of claim 1 wherein the polymer molecules are block copolymers and the crosslinkable groups are contained in at least one block of the polymer molecule.

32. The method of claim 1 wherein the polymer molecules have a backbone comprised of monomer units selected from the group consisting of ethylenically unsaturated polymerizable monomers, nitrogenous polymers, olefins, condensation monomers, ring-opening monomers, esters, sulfones, lactides, lactones, carbonates, imides, arylenes, amides, propylene, ethers, urethanes, vinyl and vinyl derivatives, and organic polysilicas.

33. The method of claim 32 wherein each crosslinkable group is directly bound to a monomer unit.

34. The method of claim 32 wherein each crosslinkable group is indirectly bound to a monomer unit through a linking group.

35. The method of claim 1 wherein the crosslinkable groups are selected from the group consisting of acryloyl, lower alkyl-substituted acryloyl, vinyl, substituted vinyl, cyclic ether, cyclic ester, activated ester, cycloalkenyl, acid halide, amino, alcohol, phenol, carboxylic acid, diacetylene, unsubstituted and substituted acetylene groups, eonophiles, dienophiles, and substituted and unsubstituted bicyclo [4.2.0]octa-1,3,5-trienyl groups.

36. The method of claim 1 wherein the crosslinked particles are randomly formed.

37. The method of claim 1 wherein the polymer molecules further comprise a chemical moiety.

38. The method of claim 37 wherein the chemical moiety is a pharmaceutical agent, a catalyst, a functional group, a surfactant, a sensor group, or a photoresponsive unit.

39. The method of claim 1 wherein (b) is conducted in the presence of a chemical moiety whereby the chemical moiety is incorporated into the crosslinked particle.

40. The method of claim 39 wherein the crosslinked particle has at least one functional group on its backbone and wherein the chemical moiety is attached to the crosslinked particle at said functional group.

41. The method of claim 40 wherein the chemical moiety is a pharmaceutical agent, a catalyst, a functional group, a surfactant, a sensor group, or a photoresponsive unit.

42. The method of claim 1, which further comprises incorporating the crosslinked particles into a matrix.

43. The method of claim 42 wherein decomposition temperature of the crosslinked particles is less than decomposition temperature of the matrix, and the method further comprises heating the matrix to the decomposition temperature of the crosslinked particles, whereby the crosslinked particles decompose to create a porous matrix.

44. A method for preparing crosslinked particles, comprising:
  (a) providing synthetic polymer molecules having a plurality of crosslinkable groups that are inert until activated, but which when activated undergo an irreversible intramolecular crosslinking reaction; and
  (b) activating the crosslinkable groups under conditions effective to promote said intramolecular crosslinking reaction, such that crosslinked particles are formed; and wherein the conditions in (b) are effective to substantially prevent intermolecular crosslinking between the polymer molecules, such that (b) results in formation of a single crosslinked particle from a single corresponding polymer molecule.

45. The method of claim 44 wherein less than 10% of the polymer molecules participate in intermolecular crosslinking.

46. The method of claim 45 wherein less than 5% of the polymer molecules participate in intermolecular crosslinking.

47. The method of claim 44 wherein the crosslinkable groups are thermally activatible; photolytically activatible; activatible with ultraviolet radiation, ionizing radiation, or electron beam radiation; or activatible by a chemical activating agent.

48. The method of claim 44 wherein the polymer molecules have a backbone comprised of monomer units selected from the group consisting of ethylenically unsaturated polymerizable monomers, nitrogenous polymers, olefins, condensation monomers, ring-opening monomers, esters, sulfones, lactides, lactones, carbonates, imides, arylenes, amides, propylene, ethers, urethanes, vinyl and vinyl derivatives, and organic polysilicas.

49. The method of claim 44 wherein the crosslinkable groups are selected from the group consisting of acryloyl, lower alkyl-substituted acryloyl, vinyl, substituted vinyl, cyclic ether, cyclic ester, activated ester, cycloalkenyl, acid halide, amino, alcohol, phenol, carboxylic acid, diacetylene, unsubstituted and substituted acetylene groups, eonophiles, dienophiles, and substituted and unsubstituted bicyclo[4.2.0]octa-1,3,5-trienyl groups.

50. The method of claim 44 wherein the crosslinked particles are randomly formed.

51. The method of claim 44 which further comprises incorporating the crosslinked particles into a matrix.

52. The method of claim 51 wherein decomposition temperature of the crosslinked particles is less than decomposition temperature of the matrix, and the method further comprises heating the matrix to the decomposition temperature of the crosslinked particles, whereby the crosslinked particles decompose to create a porous matrix.

53. A method for preparing crosslinked particles in a solvent, comprising:
   (a) providing synthetic polymer molecules having a plurality of crosslinkable groups that are inert until activated, but which when activated undergo an irreversible intramolecular crosslinking reaction to form a crosslinked particle;
   (b) activating the crosslinkable groups; and
   (c) adding the synthetic polymer molecules to a solvent under conditions effective to allow said irreversible intramolecular crosslinking reaction to take place while substantially preventing intermolecular reaction, resulting in formation of a single crosslinked particle from a corresponding polymer molecule in said solvent.

54. The method of claim 53 wherein (b) is carried out prior to (c).

55. The method of claim 53 wherein (b) is carried out during or subsequent to (c).

56. The method of claim 53 comprising repeating (a), (b) and (c) without diluting the solvent or removing crosslinked particles therefrom.

57. The method of claim 53 wherein in (a), the synthetic polymer molecules are provided in solution.

58. The method of claim 57 wherein the conditions comprise providing the solution at a sufficiently dilute concentration so as to substantially prevent intermolecular reactions following activation of the crosslinking groups.

59. The method of claim 53 wherein the conditions comprise adding a synthetic polymer molecules to the solvent slowly so as to substantially prevent intermolecular crosslinking between the polymer molecules relative to the rate at which the intramolecular crosslinking reaction occurs.

60. The method of claim 53 wherein the conditions comprise adding the solution of the synthetic polymer molecules to the solvent slowly so as to substantially prevent intermolecular crosslinking between the polymer molecules.

61. The method of claim 53 wherein the solvent is selected from the group consisting of benzyl ether; N-cyclohexylpyrrolidinone; N-methylpyrrolidone; dimethylacetamide; dimethylphenyl urea; N,N-dimethyltrimethylene urea; butyl acetate; 2-ethoxyethanol; cyclopentanone; cyclohexanone; γ-butyrolactone; lactate esters; ethoxyethylpropionate; alkylene glycol alkyl ether esters; alkylene glycol alkyl ethers; alkylene glycol monoalkyl esters; butyl acetate; 2-ethoxyethanol; ethyl 3-ethoxypropionate; polyethylene glycols and alkyl and aryl derivatives; diphenyl ether; diphenyl sulfone; ethylene carbonate; and mixtures thereof.

62. The method of claim 53 wherein the crosslinkable groups are thermally activatible, and the solvent is at a temperature sufficiently high to activate the crosslinkable groups.

63. The method of claim 53 which further comprises incorporating the crosslinked particles into a matrix.

64. The method of claim 63 wherein decomposition temperature of the crosslinked particles is less than decomposition temperature of the matrix, and the method further comprises heating the matrix to the decomposition temperature of the crosslinked particles, whereby the crosslinked particles decompose to create a porous matrix.

* * * * *